United States Patent
Amarasinghe et al.

(10) Patent No.: US 7,313,159 B2
(45) Date of Patent: Dec. 25, 2007

(54) APPARATUS AND METHOD FOR PROVIDING A SINGLE-MODE GRATING-OUTCOUPLED SURFACE EMITTING LASER WITH DETUNED SECOND-ORDER OUTCOUPLER GRATING

(75) Inventors: Nuditha Vibhavie Amarasinghe, Richardson, TX (US); Taha Masood, Plano, TX (US); Steven Gregory Patterson, Plano, TX (US); Gary Alan Evans, Plano, TX (US)

(73) Assignee: Photodigm, Inc., Richardson, TX (US)

( * ) Notice: Subject to any disclaimer, the term of this patent is extended or adjusted under 35 U.S.C. 154(b) by 466 days.

(21) Appl. No.: 11/021,535

(22) Filed: Dec. 23, 2004

(65) Prior Publication Data

US 2006/0140237 A1    Jun. 29, 2006

(51) Int. Cl.
*H01S 3/08* (2006.01)
*H01S 5/00* (2006.01)

(52) U.S. Cl. .................. 372/102; 372/50.1; 372/50.11; 372/50.124

(58) Field of Classification Search ........... 372/50.124, 372/102, 50.1
See application file for complete search history.

(56) References Cited

U.S. PATENT DOCUMENTS

| | | | | |
|---|---|---|---|---|
| 4,958,357 A | * | 9/1990 | Kinoshita | 372/96 |
| 5,003,550 A | * | 3/1991 | Welch et al. | 372/50.22 |
| 5,131,001 A | * | 7/1992 | Carlson | 372/50.22 |
| 5,448,581 A | * | 9/1995 | Wu et al. | 372/45.01 |
| 5,617,436 A | * | 4/1997 | Lo | 372/45.011 |
| 6,018,540 A | * | 1/2000 | Kinoshita | 372/46.01 |
| 6,081,636 A | * | 6/2000 | Kinoshita | 385/24 |
| 6,636,547 B2 | * | 10/2003 | Evans et al. | 372/108 |
| 6,647,048 B2 | * | 11/2003 | Evans | 372/50.11 |
| 6,661,825 B2 | * | 12/2003 | Evans et al. | 372/50.1 |
| 6,714,575 B2 | * | 3/2004 | Evans | 372/50.1 |
| 6,810,067 B2 | * | 10/2004 | Masood et al. | 372/102 |
| 2002/0086454 A1 | * | 7/2002 | Evans et al. | 438/31 |
| 2003/0147439 A1 | * | 8/2003 | Shams-Zadeh-Amiri et al. | 372/45 |

* cited by examiner

*Primary Examiner*—Armando Rodriguez
*Assistant Examiner*—Phillip Nguyen
(74) *Attorney, Agent, or Firm*—Duke W. Yee; Mari A Stewart

(57) ABSTRACT

An improved grating-outcoupled surface-emitting semiconductor laser architecture is provided. A second-order grating is placed between two distributed Bragg reflector gratings. The period of the second order grating is positively or negatively detuned from the distributed Bragg reflector selected optical wavelength at which the laser operates. Detuning of the second-order grating towards shorter or longer wavelengths allows kink-free, linear LI curves light output versus forward current) for grating-outcoupled surface-emitting lasers. Due to the detuning of the outcoupler grating, the outcoupled radiation emits two beams that deviate slightly from the normal axis. A design point may then be chosen where the power outcoupled by symmetric and antisymmetric modes cross and where the outcoupled power is independent of the phase variation.

14 Claims, 7 Drawing Sheets

Symmetric (radiating) Mode

Antisymmetric (non-radiating) Mode

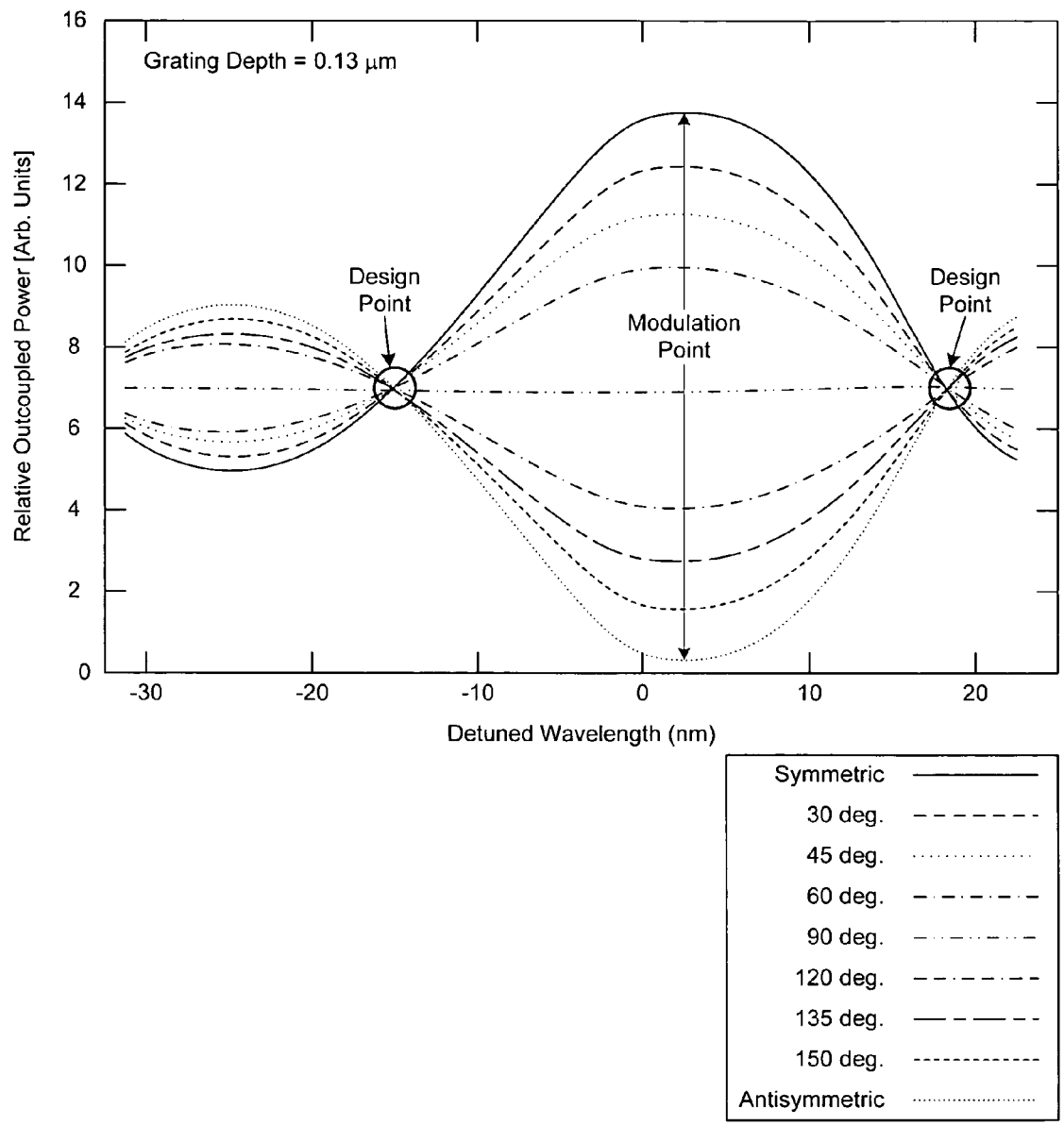

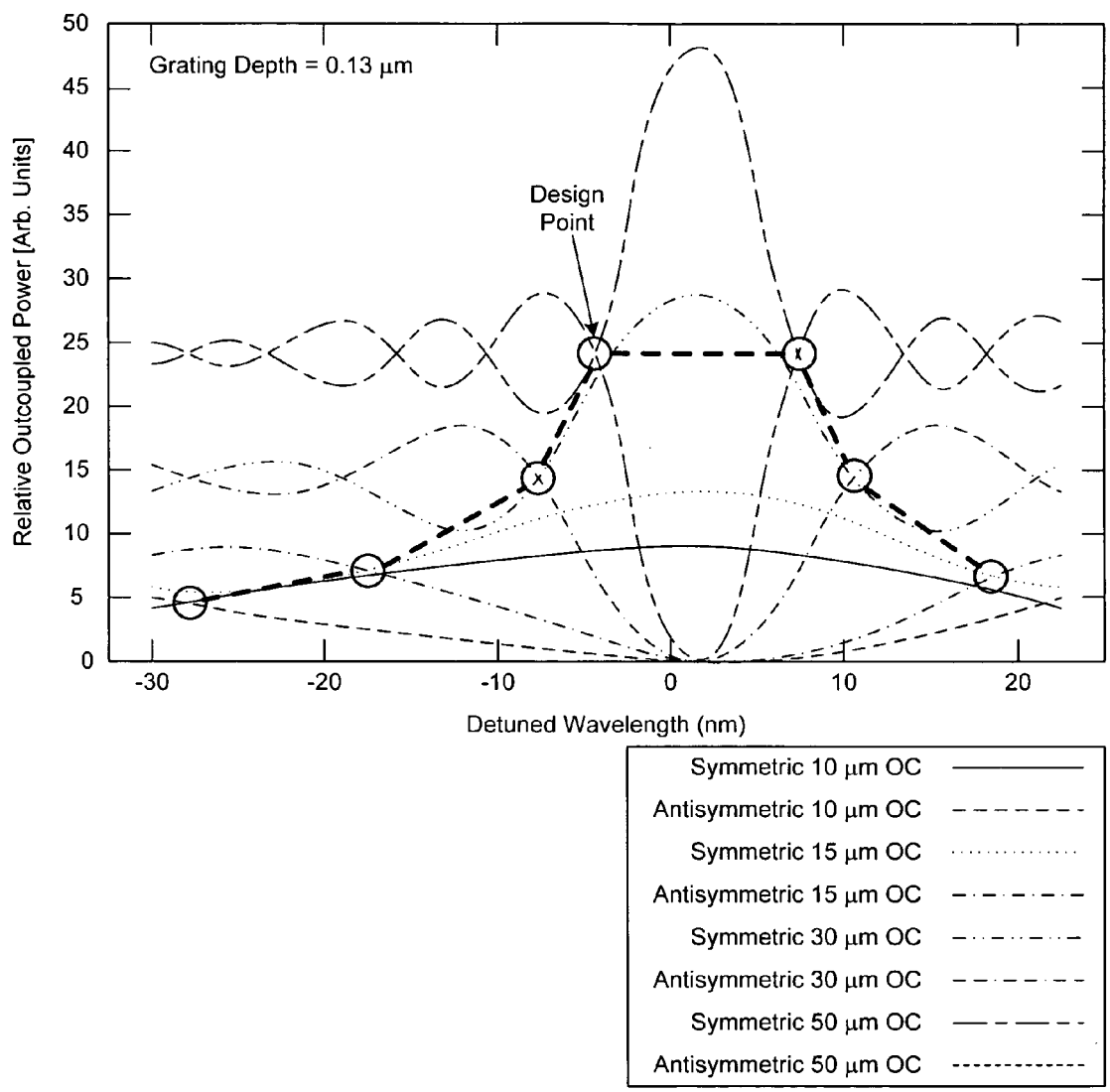

APPARATUS AND METHOD FOR PROVIDING A SINGLE-MODE GRATING-OUTCOUPLED SURFACE EMITTING LASER WITH DETUNED SECOND-ORDER OUTCOUPLER GRATING

BACKGROUND OF THE INVENTION

1. Technical Field

The present invention is directed generally toward a method and apparatus for providing a grating-outcoupled surface emitting laser, i.e. a GSE laser. More specifically, the present invention is directed to an apparatus and method for providing a single-mode GSE laser with a detuned second-order outcoupler grating.

2. Description of the Related Art

Transmission of light through waveguides has been pursued for many types of communications applications. Light signals offer many potential advantages over electronic signals. Light sources are commonly created from semiconductor devices, and include semiconductor devices such as light emitting diodes (LED) and laser diodes (LD).

Optical fiber is the most commonly used transmission medium for light signals. A single fiber is capable of carrying several different modulated signals within it at one time. For instance, wavelength division multiplexing divides the used bandwidth of the fiber into different channels, each channel containing a small range of wavelengths, and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

The Grating-Outcoupled Surface-Emitting (GSE) laser (described in commonly assigned U.S. patent application Ser. Nos. 09/844,484 and 09/845,029, both of which are hereby incorporated by reference), is an essentially planar structure which provides out-of-plane optical emission. The GSE laser has a built-in horizontal waveguide that allows on-wafer or on-chip routing and control of light along with emission from the surface of the wafer or chip. In contrast, the light from vertical cavity surface-emitting lasers (VCSELs) is directed normal to the wafer or chip surface and cannot easily be routed within the wafer or chip. The epitaxial structure of a VCSEL is very thick and therefore costly and time consuming to grow, compared to the relatively thin layers making up an edge-emitting (EE) or GSE laser. While EE lasers have a horizontal waveguide and can route light within a wafer or chip, at least one terminating edge (cleaved or etched) is required to access or connect the on-chip light to the outside world. Thus EE lasers are inherently edge-bound (and hence not fully integrable), while VCSELs have incompatibility due to their very special epitaxy requirements.

SUMMARY OF THE INVENTION

The present invention provides an improved grating-outcoupled surface-emitting semiconductor laser architecture. A second-order grating is placed between two distributed Bragg reflector gratings. The period of the second order grating is positively or negatively detuned from the distributed Bragg reflector selected optical wavelength at which the laser operates. Detuning of the second-order grating towards shorter or longer wavelengths allows kink-free, linear LI curves light output versus forward current) for grating-outcoupled surface-emitting lasers. Due to the detuning of the outcoupler grating, the outcoupled radiation emits two beams that deviate slightly from the normal axis. A design point may then be chosen where the power coutcoupled by symmetric and antisymmetric modes cross and where the outcoupled power is independent of the phase variation.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 4 illustrates the theoretical relative outcoupled power versus detuning;

FIG. 5 illustrates the radiated power by the symmetric and antisymmetric mode for various outcoupler lengths as a function of detuning wavelength;

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

The present invention provides an improved single-mode grating-outcoupled surface emitting (GSE) semiconductor laser architecture with a detuned second-order outcoupler grating. The period of the second-order grating, which is placed somewhere between two distributed Bragg reflector (DBR) gratings, is positively or negatively detuned from the DBR selected optical wavelength at which the laser operates. Detuning of the second-order grating towards shorter or longer wavelengths allows kink-free, linear LI curves for GSE lasers. An LI curve illustrates light output versus forward current. Due to the detuning of outcoupler grating, the outcoupled radiation emits in two beams that deviate slightly from the normal axis. If the detuning is small then the output beams overlap, giving rise to a more circular beam with a single-lobe far-field.

Figure 1A:
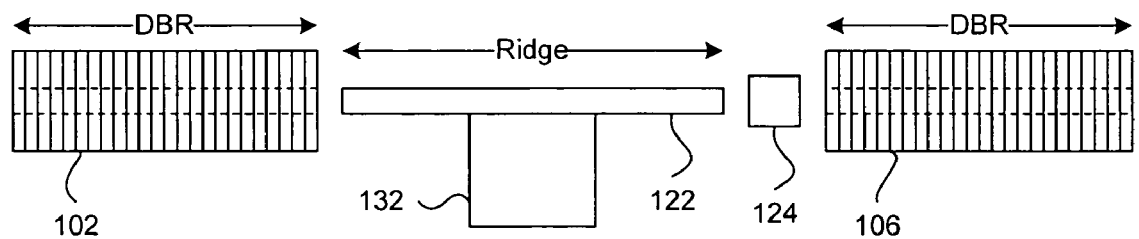
FIGS. 1A and 1B present a pictorial representation of a grating-outcoupled surface emitting laser device with a second-order outcoupler grating in accordance with an exemplary embodiment of the present invention.
Figure 1B:
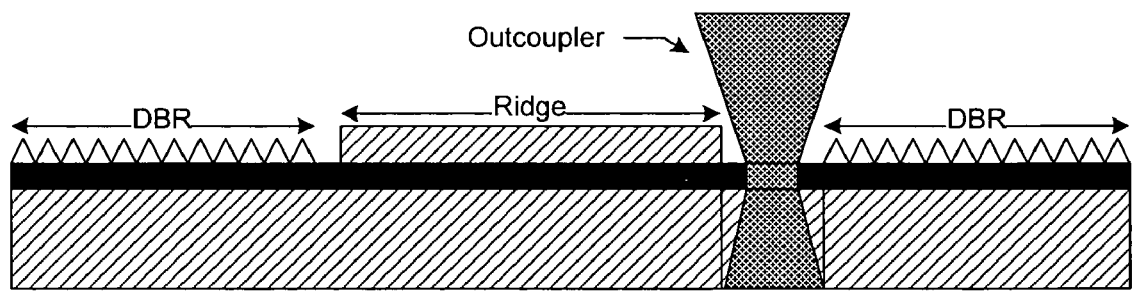

FIGS. 1A and 1B present a pictorial representation of a grating-outcoupled surface emitting laser device with integrated high speed modulator in accordance with an exemplary embodiment of the present invention. In this instance, the device consists of a second-order grating, which is placed somewhere between two distributed Bragg reflector (DBR) gratings.

More particularly, FIG. 1A illustrates a top view of an example grating-outcoupled surface emitting laser device in accordance with a preferred embodiment of the present invention. FIG. 1B illustrates a side view of the GSE laser device. The device consists of a gain region defined by an active ridge 122 which is terminated at each end by a narrow-band, first-order, shallow, distributed Bragg reflector (DBR) 102, 106. DBR 102 and DBR 106 are highly reflective (approximately 100 percent) to only a single Fabry Perot wavelength at each end of the ridge. The lasing action takes place between the two DBRs 102, 106 as a standing wave, which results from repeated interference of two counter propagating waves of identical frequency being formed inside the lasing cavity.

The second-order outcoupler grating 124 is placed between the distributed Bragg reflectors 102, 106. On-resonance the second-order grating 124 provides wavelength selective feedback and equally converts the incident power into output radiation in the air as well as the substrate. The period of the second-order grating 124 can be positively or negatively detuned from the DBR selected optical wavelength at which the laser operates. Detuning refers to how much the outcoupler wavelength deviates from the DBR wavelength. The main reason for detuning the second-order grating towards shorter or longer wavelengths is to obtain kink-free operation of the GSE laser. As shown in FIG. 4, detuning of −15 or +18 nm for a particular outcoupler grating provides a constant fraction of outcoupled light independent of the relative phases of the waves incident into the outcoupler region. Due to detuning of the outcoupler grating 124, the outcoupled radiation emits in two beams that deviate slightly from the normal axis. If the detuning is small then the output beams overlap, giving rise to a slightly broadened single-lobe far-field compared to the on-reasonance outcoupling far-field. Detuning may be desirable for many applications and is especially desirable for GSE lasers that do not contain a phase shift section so that kink-free LI curves are obtained.

This GSE device, which has an on-resonance grating outcoupler, is detuned as follows. First the ridge 122 is biased to a fixed current above a threshold. The laser current is applied to ridge 122 through contact pad 132 and the laser is detuned by biasing the laser current.

Figure 2:
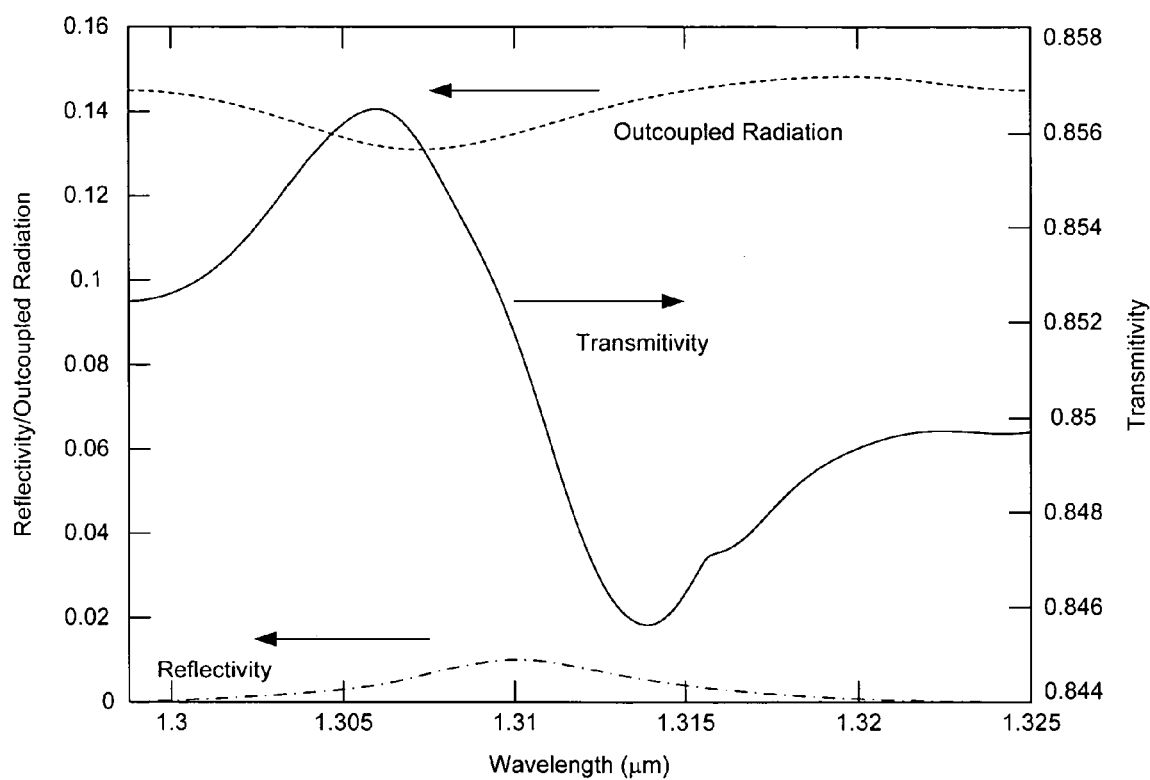
FIG. 2 illustrates the theoretical reflectivity, transmittivity and outcoupled radiation per pass from a grating outcoupler as a function of detuning.

FIG. 2 illustrates the theoretical reflectivity, transmittivity and outcoupled radiation per pass as a function of detuning from the Bragg (resonance) condition for a 30 μm long and 0.13 μm deep second-order outcoupler grating formed on a standard 1310 nm epitaxial structure. As shown in FIG. 2, the reflectivity of the second-order grating peaks at the Bragg wavelength whereas the total power radiated into the air and substrate decreases. This drop in power is due to the destructive interference between the primary traveling wave and the portion reflected by the second-order grating. As the second-order grating is positively or negatively detuned from the Bragg wavelength, the reflectivity of the second-order grating rapidly approaches zero and the fraction of the incident power radiated, into the air and substrate, stabilizes.

The on-resonance feedback from the second-order gratings can disturb the lasing cavity, which may cause changes in the laser's spectral mode behavior over the modulating current range, resulting in mode hops or transitions from single- to multi-longitudinal-mode operation. To prevent undesirable feedback from the second-order outcoupler grating, the outcoupler grating Bragg (resonance) wavelength or periodicity is detuned from the DBR selected lasing wavelength.

Figure 3A:
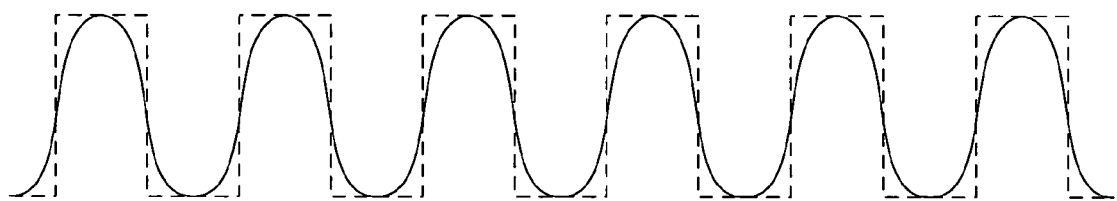
FIGS. 3A and 3B illustrate the symmetric as well as the antisymmetric alignment of the second-order gratings with respect to the on-resonance standing wave.
Figure 3B:
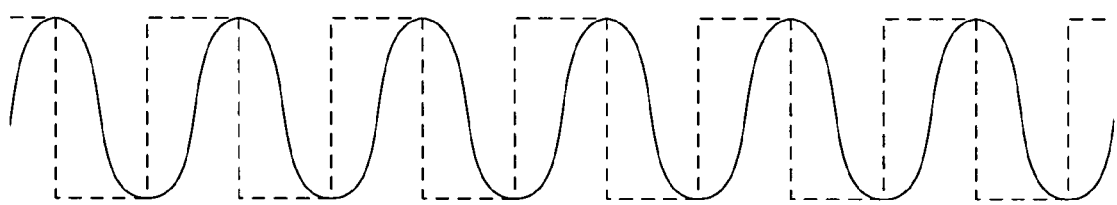

The relative position of outcoupler grating to the standing wave formed between the narrow-band DBRs cannot be precisely controlled because, given the state of the art of the current fabrication processes, it is difficult to control the position of the first grating teeth of the first and second order gratings and the active region length to better than a fraction of a wavelength. The two extreme cases of resonant standing-wave mode positions in relation to the second-order outcoupler grating are shown in FIGS. 3A and 3B. FIG. 3A illustrates the symmetric alignment and FIG. 3B illustrates the antisymmetric alignment of the second-order gratings with respect to the on-resonance standing wave. These waveguide modes are the only two possible solutions for the infinite length grating problem and correspond to the case in which the counter propagating waves that form the standing wave are either in-phase (symmetric mode) or 180 degrees out-of-phase (antisymmetric mode) with respect to each other. But for a finite length outcoupler, the second-order grating can take any position relative to the on-resonant standing wave provided the finite length grating solution can be represented by a linear combination of the two finite-length grating solutions. The position of the grating in relation to the standing wave will then correspond to the forward and backward propagating waves being anywhere from 0 to 180 degrees out-of-phase.

FIG. 4 is a theoretical plot of the outcoupled power versus detuning from the Bragg wavelength for a 15 μm long outcoupler. The power radiated from the outcoupler of a given length is maximum when the outcoupler grating period is on (or very near) the Bragg wavelength and the counter propagating waves entering the outcoupler from each end are in-phase with each other (symmetric mode). The outcoupler does not radiate if the counter propagating waves are 180 degrees out-of-phase (antisymmetric mode). The outcoupled power decreases monotonically as the relative phase of the forward and backward propagating waves varies from 0 to 180 degrees. At 90 degrees out-of-phase, the outcoupled power is half of the in-phase condition. The radiated power also decreases as the second-order grating is positively or negatively detuned from the Bragg wavelength and the relative phase between the counter propagating waves is equal to or greater than 0 but less than 90 degrees. On the other hand, the radiated power increases as the second-order outcoupler grating is positively or negatively detuned from the Bragg wavelength and the relative phase between the counter propagating waves is greater than 90 degrees. The power outcoupled does not change with detuning if the forward and backward propagating waves are 90 degrees out-of-phase.

Since it is difficult to control the optical length of the gain region or the position of the first grating tooth to less than a wavelength with the current state of the art technology, the relative phase of the counter running waves entering the second-order grating may vary from device to device within the same wafer and/or from wafer to wafer. As the phase varies, so will the outcoupled power, resulting in yield loss. Furthermore, as the current applied to the device is increased during modulation, the cavity modes (or gain curve) tune to longer wavelength at a faster rate than the reflectivity spectrum. As the longitudinal mode with the highest gain moves away from the DBR reflectivity peak, there comes a point where an adjacent cavity mode has higher reflectivity. At this point, the GSE laser may mode-hop one longitudinal mode to a shorter wavelength generating a new standing wave whose relative position with respect to the outcoupler gratings of phase is different from the original standing wave. Depending on the phase, the outcoupled power can be either greater than, less than, or substantially the same compared to the radiated power before the mode shift. If the variation in outcoupled power is significant, then this results in detectable non-linearities or "kinks" in the LI curve.

FIG. 5 illustrates the radiated power by the symmetric and antisymmetric mode for 10 µm, 15 µm, 30 µm, and 50 µm, long outcoupler lengths as a function of detuning wavelength. The point where the power outcoupled by symmetric and antisymmetric modes cross is the point where the outcoupled power is independent of phase variations.

Figure 6:
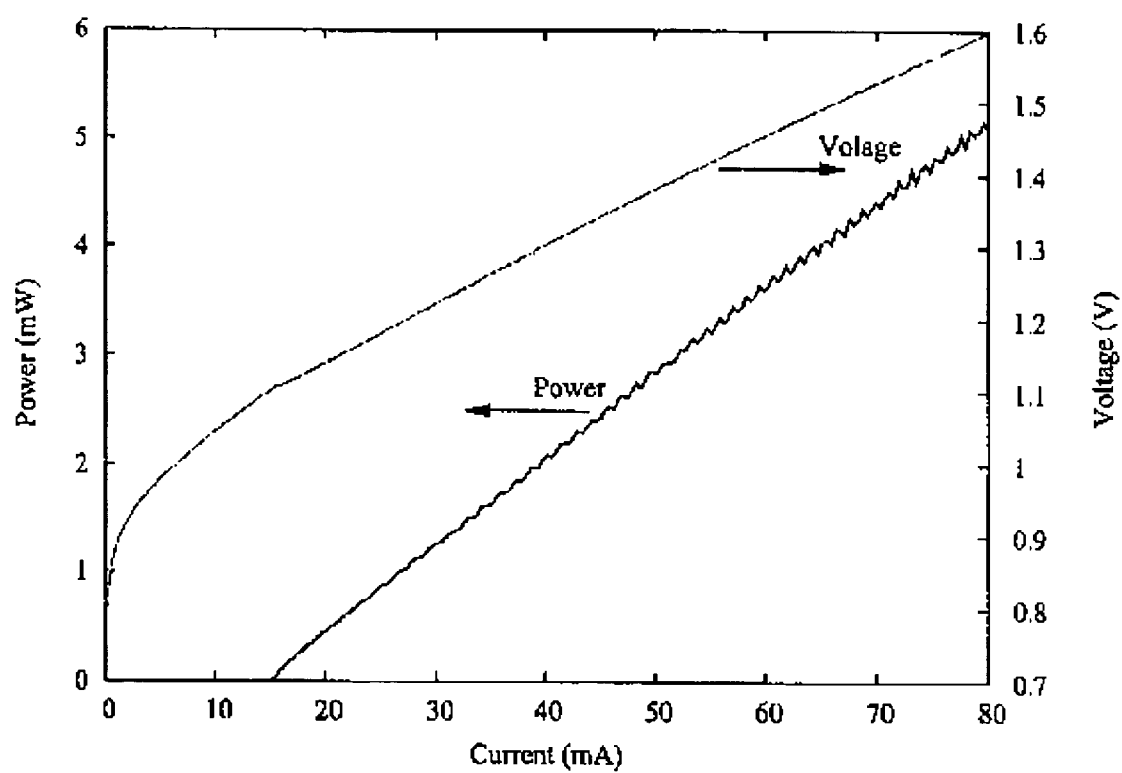
FIG. 6 illustrates an LIV curve at room temperature for a grating-outcoupled surface-emitting semiconductor laser with a detuned second-order grating.
Figure 7:
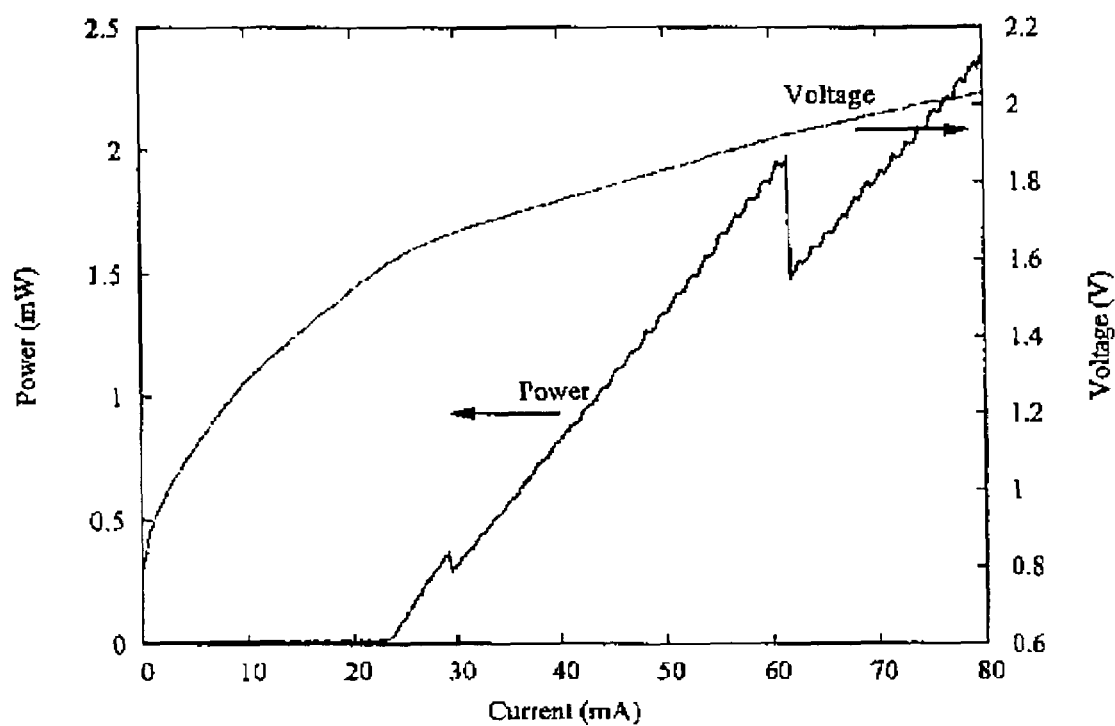
FIG. 7 illustrates an LIV curve at room temperature for a grating-outcoupled surface-emitting semiconductor laser with in-phase outcoupler grating.

In FIGS. 6 and 7, typical LIV curves are shown for two GSE lasers with 400 µm long gain section and 200 µm long DBRs on each end. The outcoupler length is 15 µm. The second-order outcoupler grating is detuned by +18 µm for the device LIV shown in FIG. 6 and is on-resonance for the LIV shown in FIG. 7.

Thus, the present invention solves the disadvantages of the prior art by providing an improved grating-outcoupled surface-emitting semiconductor laser architecture. A second-order grating is placed between two distributed Bragg reflector gratings. The period of the second order grating is positively or negatively detuned from the distributed Bragg reflector selected optical wavelength at which the laser operates. Detuning of the second-order grating towards shorter or longer wavelengths allows kink-free, linear LI curves light output versus forward current) for grating-outcoupled surface-emitting lasers. Due to the detuning of the outcoupler grating, the outcoupled radiation emits two beams that deviate slightly from the normal axis. A design point may then be chosen where the power coutcoupled by symmetric and antisymmetric modes cross and where the outcoupled power is independent of the phase variation.

What is claimed is:

1. A surface emitting laser diode system, comprising:
   first and second reflective gratings at either end of the laser, wherein the first and second reflective gratings each have a unique reflective spectrum covering a broad band of light wavelengths; and
   an outcoupling region between the first and second reflective gratings, wherein the outcoupling region has a grating that couples a light beam out of the laser, and wherein the outcoupling grating has a unique reflective spectrum covering a wide band of light wavelengths, wherein the reflective spectrum of the outcoupling grating comprises a second-order of the reflective spectra of the first and second reflective gratings, and a period of the outcoupling grating is selected so as to detune the reflective spectrum of the outcoupling grating away from the reflective spectra of the first and second reflective gratings, wherein an optical wavelength of the outcoupling grating is detuned by a value at which outcoupled power is phase insensitive.

2. The surface emitting laser diode system of claim 1, wherein the first and second reflective gratings are Bragg reflectors.

3. The surface emitting laser diode system of claim 1, wherein the outcoupling grating comprises a second-order reflective grating.

4. The surface emitting laser diode system of claim 1, wherein the surface emitting laser diode system comprises a single-mode, grating-outcoupled surface emitting laser including a second-order reflective grating for detuning an optical wavelength of said laser.

5. The surface emitting laser diode system of claim 1, wherein the first and second reflective gratings are distributed Bragg reflector gratings.

6. The surface emitting laser diode system of claim 1, wherein said period is selected so as to positively or negatively detune an optical wavelength of said outcoupling grating away from an optical wavelength of said laser, said optical wavelength of said laser determined by said first and second reflective gratings.

7. The surface emitting laser diode system of claim 1, further comprising:
   a narrow-band, first-order, shallow distributed Bragg reflector.

8. The surface emitting laser diode system of claim 1, wherein said period of the outcoupling grating is detuned from the distributed Bragg reflector selected resonance wavelength.

9. A grating-outcoupled surface emitting laser, comprising:
   an optical cavity;
   at least one gain section;
   at least one grating section positioned to outcouple light, wherein the optical wavelength of the outcoupling grating is detuned by a value at which outcoupled power is phase insensitive; and
   at least one distributed Bragg reflectors section to provide wavelength selective feedback to said lasing optical cavity.

10. The grating-outcoupled surface emitting laser of claim 8, wherein said at least one gain region comprises a ridge.

11. A method for obtaining a kink-free linear curve for a grating outcoupled surface emitting laser having a finite length outcoupling aperture, comprising the steps of:
   providing first and second reflective gratings at either end of the laser, wherein the first and second reflective gratings each have a unique reflective spectrum covering a broad band of light wavelengths;
   providing an outcoupling region between the first and second reflective gratings, wherein the outcoupling region has a grating that couples a light beam out of the laser, and wherein the outcoupling grating has a unique reflective spectrum covering a wide band of light wavelengths, wherein the reflective spectrum of the outcoupling grating comprises a second-order of the reflective spectra of the first and second reflective gratings; and
   selecting a period of the outcoupling grating so as to detune the reflective spectrum of the outcoupling grating from the selected resonance wavelength and the optical wavelength of the outcoupling grating is detuned by a value at which outcoupled power is phase insensitive.

12. The method of claim 10, wherein said period is selected so as to positively or negatively detune an optical wavelength of said outcoupling grating away from an optical wavelength of said laser, said optical wavelength of said laser determined by said first and second reflective gratings.

13. A method for obtaining a kink-free linear power-current curve for a grating outcoupled surface emitting laser having a finite length outcoupling aperture, comprising the steps of:

provining an optical cavity;

providing at least one gain section;

providing at least one grating section positioned to outcouple light, wherein an optical wavelength of an outcoupling grating is detuned by a value at which outcoupled power is phase insensitive;

providing at least one distributed Bragg reflector section, said at least one distributed Bragg reflector section providing wavelength selective feedback to said lasing optical cavity; and selecting a period of said at least one grating section so as to detune the reflective spectrum of said at least one grating section from the distributed Bragg reflector selected resonance wavelength.

14. The method of claim 13, wherein said period is selected so as to positively or negatively detune an optical wavelength of said outcoupling grating away from an optical wavelength of said laser, said optical wavelength of said laser determined by said first and second reflective gratings.

* * * * *